United States Patent
Francese et al.

(10) Patent No.: US 10,742,026 B2
(45) Date of Patent: Aug. 11, 2020

(54) ELECTROSTATIC PROTECTION DEVICE

(71) Applicant: International Business Machines Corporation, Armonk, NY (US)

(72) Inventors: Pier Andrea Francese, Adliswil (CH); Thomas Morf, Gross (CH)

(73) Assignee: International Business Machines Corporation, Armonk, NY (US)

(*) Notice: Subject to any disclaimer, the term of this patent is extended or adjusted under 35 U.S.C. 154(b) by 361 days.

(21) Appl. No.: 15/891,052

(22) Filed: Feb. 7, 2018

(65) Prior Publication Data
US 2019/0245345 A1 Aug. 8, 2019

(51) Int. Cl.
| H02H 9/00 | (2006.01) |
| H02H 9/04 | (2006.01) |
| H01L 27/02 | (2006.01) |
| H03H 7/01 | (2006.01) |
| H03H 7/09 | (2006.01) |
| H01L 49/02 | (2006.01) |
| H03H 7/38 | (2006.01) |
| H03H 1/00 | (2006.01) |

(52) U.S. Cl.
CPC ......... H02H 9/046 (2013.01); H01L 27/0255 (2013.01); H01L 27/0288 (2013.01); H03H 7/0107 (2013.01); H03H 7/09 (2013.01); H01L 28/10 (2013.01); H01L 28/40 (2013.01); H03H 7/38 (2013.01); H03H 2001/0078 (2013.01); H03H 2001/0092 (2013.01)

(58) Field of Classification Search
None
See application file for complete search history.

(56) References Cited

U.S. PATENT DOCUMENTS

| 5,901,022 A | 5/1999 | Ker |
| 5,969,929 A * | 10/1999 | Kleveland .......... H01L 27/0248 361/111 |
| 8,395,234 B2 | 3/2013 | Okushima et al. |

(Continued)

FOREIGN PATENT DOCUMENTS

| CN | 104319271 A | 1/2015 |
| JP | 5411691 B2 | 7/2011 |
| WO | WO 2013058144 | 4/2013 |

OTHER PUBLICATIONS

Naiwen Zhou et al., A 28-Gb/s transmitter with 3-tap FFE and t-coil enhanced terminal in 65-nm CMOS, Published in: New Circuits and Systems Conference (NEWCAS), 2016 14th IEEE International, Date of Conference: Jun. 26-29, 2016, pp. 1-4.

(Continued)

*Primary Examiner* — Stephen W Jackson
(74) *Attorney, Agent, or Firm* — Daniel Morris; Otterstedt, Wallace & Kammer, LLP

(57) ABSTRACT

Aspects of the invention provide for an electrostatic protection device for protecting an input port of an electronic circuit. The electrostatic protection device includes a stacked coil assembly with four ports. The electrostatic protection device further includes a human body model ESD protection circuit, a charge device model ESD protection circuit, and an impedance matching circuit. The human body model ESD protection circuit, the charge device model ESD protection circuit, and the impedance matching circuit are connected to separate ports selected from the four ports.

20 Claims, 8 Drawing Sheets

(56) References Cited

U.S. PATENT DOCUMENTS

| | | |
|---|---|---|
| 9,502,168 B1 | 11/2016 | Ler et al. |
| 2011/0234295 A1 | 9/2011 | Uejima et al. |
| 2012/0314328 A1 | 12/2012 | Dill et al. |

OTHER PUBLICATIONS

Min-Sun Keel and Elyse Rosenbaum, CDM-reliable T-coil techniques for high-speed wireline receivers, Published in: Electrical Overstress/Electrostatic Discharge Symposium (EOS/ESD), 2015 37th, Date of Conference: Sep. 27-Oct. 2, 2015, pp. 1-10.
PCT/ISA/CN PCT International Search Report and Written Opinion, PCT International Patent Application No. PCT/IB2019/050479, dated May 29, 2019, pp. 1-9.

* cited by examiner

ELECTROSTATIC PROTECTION DEVICE

BACKGROUND

The present invention relates to integrated circuits, in particular to the electrostatic protection of input ports for integrated circuits.

Integrated circuits (ICs) may incorporate dedicated circuitry to protect them against Electrostatic Discharge ESD events at their input/output I/O pads. The fulfillment of this ESD protection requirement may be challenging when broadband high-frequency signals are transmitted and/or received across the I/O pads of the IC.

In particular the implementation of ESD protections is of concern in transceiver circuits used in modern broadband communication systems, in which signals with power spectral distributions in the 1 to 100 GHz frequency range are transmitted across high-loss wire-line channels. Typical channels consists of copper traces on Printed Circuit Boards PCBs, connectors and cables, and they may have matched impedance at their ends, which is either defined by the transmission standard or selected by optimization such as for speed, power and signal integrity.

SUMMARY

According to an embodiment of the present invention, the invention provides for an electrostatic protection device for protecting an input port of an electronic circuit. The electrostatic protection device comprises a stack coil assembly with four ports. The electrostatic protection device further comprises a human body model ESD or electrostatic discharge protection circuit. The electrostatic protection device further comprises a charge device model ESD protection circuit. The electrostatic protection device further comprises an impedance matching circuit. The human body model ESD protection circuit, the charge device model ESD protection circuit, and the impedance matching circuit are connected to separate ports selected from the four ports.

According to a further embodiment of the present invention, the invention further provides for an integrated circuit incorporating the electrostatic protection device for protecting an input port of an electronic circuit.

BRIEF DESCRIPTION OF THE DRAWINGS

In the following

DETAILED DESCRIPTION

Figure 1:
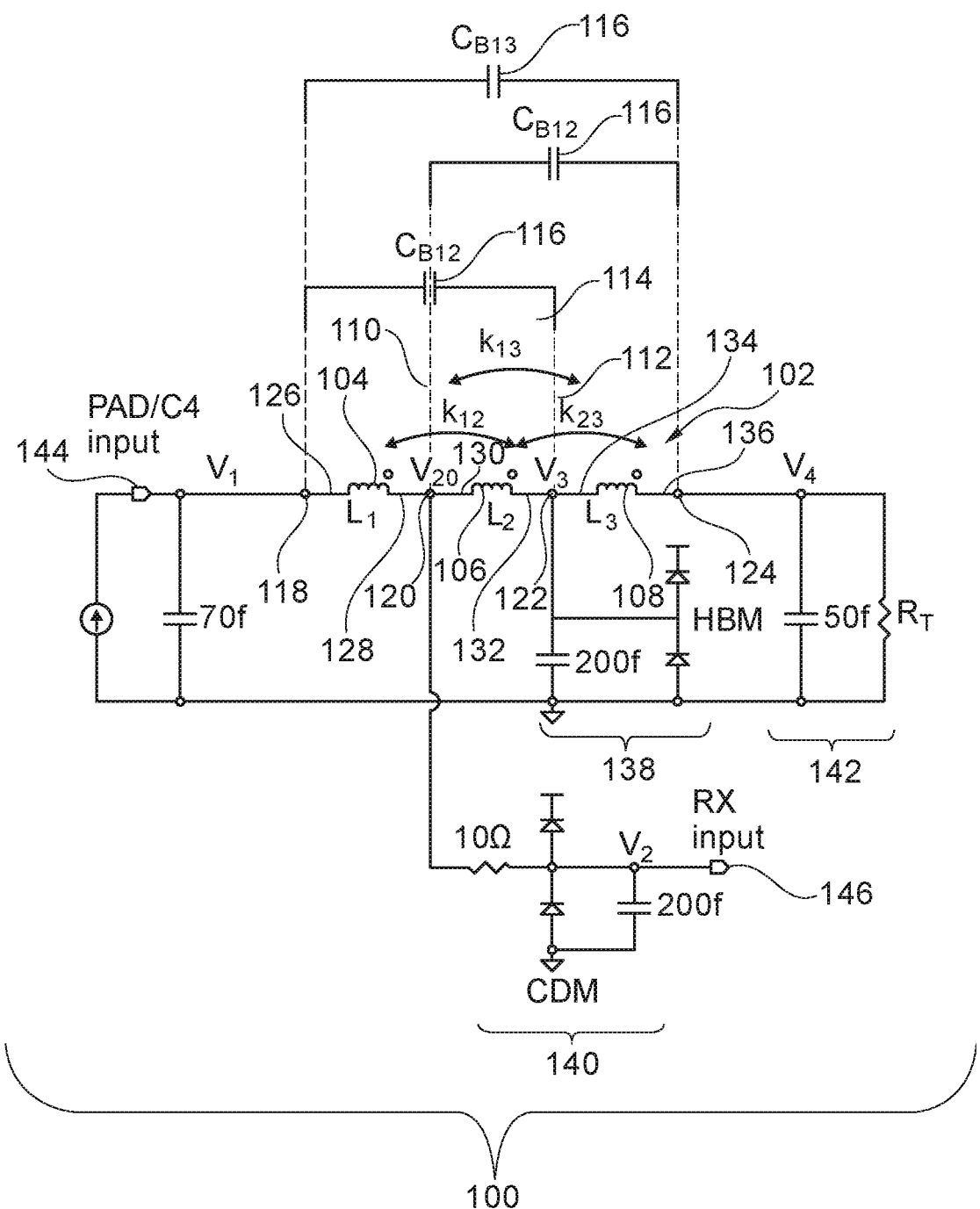
FIG. 1 illustrates an embodiment of an electrostatic protection device.

Like numbered elements in these figures are either equivalent elements or perform the same function. Elements which have been discussed previously will not necessarily be discussed in later figures if the function is equivalent.

The use of a stacked coil assembly with four ports with each of the ports being separately connected to the human body model ESD protection circuit, the charge device model ESD protection circuit, and the impedance matching circuit may enable an increase in both the bandwidth and signal transmission for the electrostatic protection device. The use of the four port device may enable an increase of about 2 in bandwidth and wider eye opening in comparison to similar three port stacked coil assemblies.

In some embodiments both the human body model (HBM) Electro Static Discharge (ESD) protection circuit and the charge device model (CDM) ESD protection circuit may refer to ESD protection circuits that incorporate clamping circuits, such as diodes, connected to both of the power supply rails. The HBM and CDM ESD devices may also, in practice, incorporate a capacitance to ground that is caused by the parasitic wiring capacitance of the diodes, for the CDM diode the diode parasitic and the RX input capacitance. The charge device model ESD may further incorporate a resistor in series with an input that limits current.

The impedance matching circuit may for instance be an inductance in parallel with the capacitance or a resistance in parallel with the capacitance for impedance matching an input to an output of the electrostatic protection device. In some examples, a resistance may be used for impedance matching. A resistor with a value of 50 Ohms, for example, may be used in many cases.

In another embodiment, the stacked coil assembly may comprise a first coil, a second coil, and a third coil. The use of the first, second, and third coil in the stacked coil assembly provides for a larger number of design parameters. For example the positioning of the first coil and the second coil can be adjusted relative to each other as well as the adjustment of the position of a third coil relative to the second coil. If the first coil, second coil, and third coil are arranged in a stack the first coil can be translated two-dimensionally with relation to the second coil and the second coil can be translated two-dimensionally with relation to the third coil. This provides for four design parameters which can be chosen freely. The size of the coils relative to each other can also be chosen, which may have the effect of adjusting the coupling coefficients of the coils. Some of the coils may have positive coupling coefficients with respect to each other and some may have negative coupling coefficients relative to each other also. This provides for additional degrees of freedom in the design process.

In one example of the above embodiment, the first coil, the second coil, and the third coil could each be planar coils. Manufacturing the coils as planar coils may enable the electrostatic protection device to be incorporated into a small area as well as being fabricated using standard semiconductor fabrication techniques. The first coil, the second coil, and the third coil may additionally be two port coils. A two port coil as used herein encompasses a coil which has an input and an output. The first coil, the second coil, and the third coil may be connected together in different arrangements to construct the four port stacked coil assembly.

In some embodiments, the first coil is at least partially overlapping with the second coil. The second coil is at least partially overlapping with the third coil. The first coil in some embodiments may also be at least partially overlapping with the third coil. The overlapping of the first, second, and/or third coil may provide for a means of adjusting the coupling between the different coils. This may aid in adjusting the parameters of the electrostatic protection device.

In another embodiment, the first coil has a first axis. The second coil has a second axis. The third coil has a third axis. The first axis, the second axis, and the third axis is an axis of symmetry. The first axis, the second axis, and the third axis may either be a center which an axis passes through or, as mentioned previously, an axis of symmetry. The first axis may in some embodiments be offset from the second axis. The second axis may in some embodiments be offset from the third axis. The first axis in some embodiments may be offset from the third axis. Likewise, the second axis may be offset in some embodiments from the third axis. Having the various axes being offset from each other may enable the tuning of the coupling between the first coil, the second coil, and/or the third coil.

In another embodiment, the first coil is inductively coupled to the second coil. The second coil is inductively coupled to the third coil. The first coil is inductively coupled to the third coil. The coupling of the three coils with each other enables the tuning of the circuit. In some embodiments the coupling coefficients between the first coil, the second coil, and the third coil are all positive. In other embodiments the first coil, the second coil and/or the third coil may have negative coupling coefficients with respect to each other also.

In another embodiment, the electrostatic protection device comprises a first port of the four ports connected to an external input port. The electrostatic protection device further comprises a second port of the four ports connected to the charge device model ESD protection circuit. The electrostatic protection device further comprises a third port connected to the human body model ESD protection circuit. The electrostatic protection device further comprises a fourth port of the four ports connected to the impedance matching circuit. The electrostatic protection device further comprises an internal input port configured for connecting between the input port of the electronic circuit and the charge device model ESD protection circuit. The design of the circuit may enable both high-frequency signaling between the internal input port and the external input port. Additionally this design may provide for a low loss of signal between the external input port and the internal input port. The internal input port may be connected to an input port of the electronic circuit.

In another embodiment the first port is connected to a first input of the first coil. The second port is connected to a second input of the first coil and a first input of the second coil. The third port is connected to a second input of the second coil and a first input of the third coil. The fourth port is connected to a second input of the third coil.

FIG. 1 illustrates a concrete example of an electrostatic protection device 100 according to the above embodiment. The electrostatic protection device comprises a stacked coil assembly 102. The stacked coil assembly comprises a first coil 104, a second coil 106, and a third coil 108. 110 represents a coupling coefficient between the first 104 and second 106 coils. 112 represents a coupling coefficient between the second 106 and the third 108 coils. 114 represents a coupling coefficient between the first 104 and third coils 108. The stacked coil assembly 102 has a first port 118, a second port 120, a third port 122, and a fourth port 124. The first coil 104 has a first input 126 attached to the first port 118. The second port 120 is connected to a second input 128 of the first coil 104 and a first input 130 of the second coil 106. The third port 122 is connected to a second input 132 of the second coil 106 and a first input 134 of the third coil 108. The fourth port 124 is connected to a second input 136 of the third coil 108. The human body model ESD protection circuit 138 is shown as being connected to the third port 122. The charge device model ESD protection circuit 140 is shown as being connected to the second port 120. There is an impedance matching circuit 142 that is connected to the fourth port 124. The impedance matching circuit 142 is shown as resistance and a capacitance in parallel. The value of the resistance is chosen to be the matching impedance, which in many cases will be 50 Ohms. The capacitance is shown as incorporating a 50 fF capacitance. This capacitance represents a parasitic capacitance of the resistance.

An external input port 144 is connected to the first port 118. An internal input port 146 is connected to the charge device model ESD protection circuit 140. The mechanical adjustment of the size of the coils 104, 106, 108 in addition to the positioning which adjusts the coupling coefficients 110, 112, 114 as well as the capacitances 116 provides for a means of adjusting the electrostatic protection device 100 such that an increased bandwidth and reduced transmission loss can be achieved. The capacitances 116 may be partially due to parasitic capacitances and may be partially due to physical capacitors added to the circuit to modify the capacitive coupling between the different coils 10, 106, and 108.

In another embodiment, the electrostatic protection device comprises a first port of the four ports connected to the charge device model ESD protection circuit. The electrostatic protection device further comprises a second port connected to an external input port configured for connecting to the input port of the electronic circuit. The electrostatic protection device further comprises a third port of the four ports connected to the human body model ESD protection circuit. The electrostatic protection device further comprises a fourth port of the four ports connected to the impedance matching circuit. The electrostatic protection device further comprises an internal input port configured for connecting between the input port of the electronic circuit and the charge device model ESD protection circuit.

In the above embodiment, the first port may be connected to a first input of the first coil. The second port may be connected to a second input of the first coil and a first input of the second coil. The third port may be connected to a second input of the second coil and a first input of the third coil. The fourth port is connected to a second input of the third coil.

Figure 2:
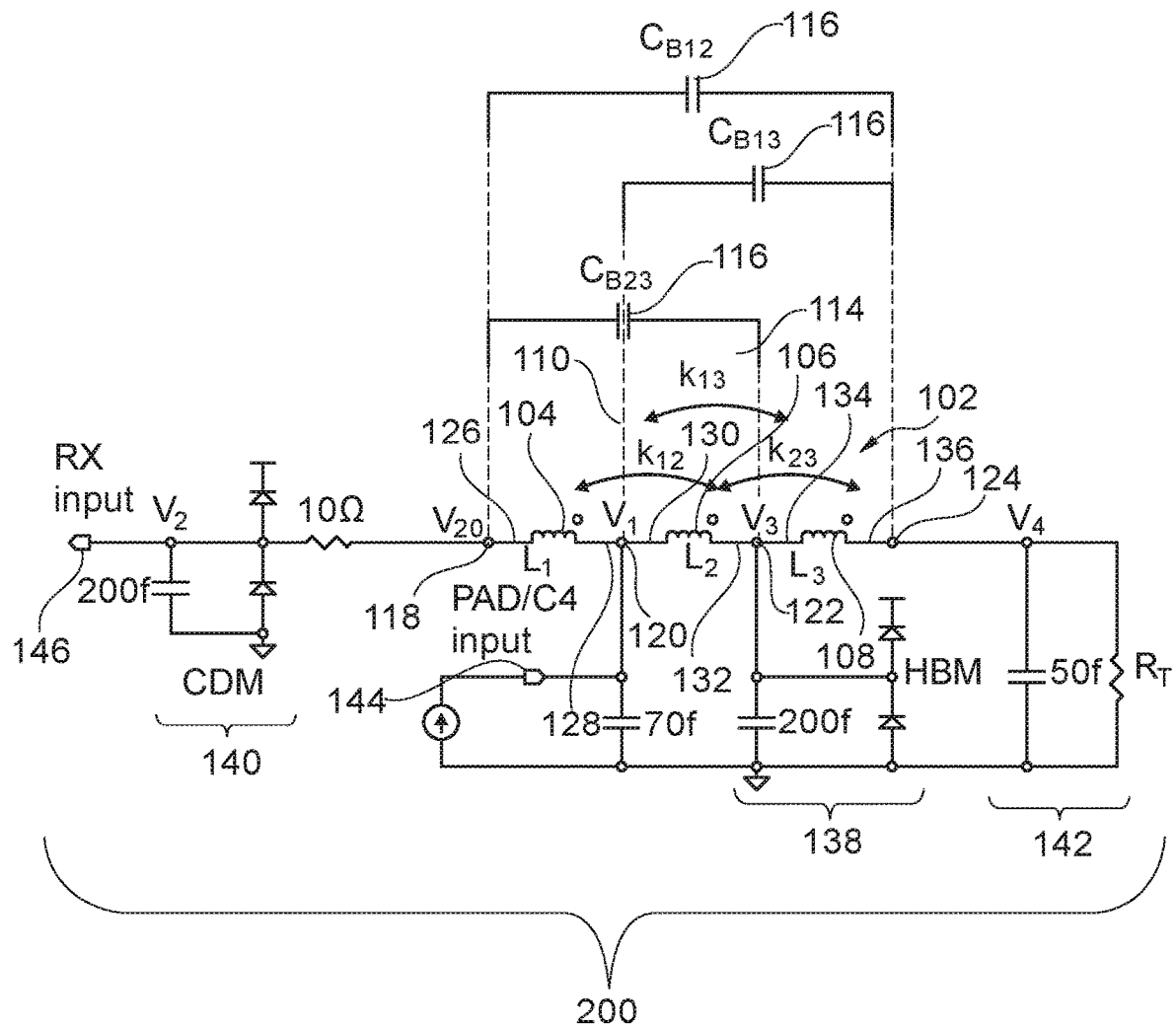
FIG. 2 illustrates a further embodiment of an electrostatic protection device.

FIG. 2 illustrates a concrete example of the above embodiment of an electrostatic protection device 200. The example shown in FIG. 2 is similar to the example illustrated in FIG. 1. However, the various components are connected to the four input ports differently. In this embodiment the impedance matching circuit 142 is again connected to the fourth port 124. The human body model ESD protection circuit 138 is again shown as being connected to the third port 122. The external input port 144 is shown as being connected to the second port 120. The charge device model ESD protection circuit 140 is shown as being connected to the first port 118. The internal input port 146 is again shown as being connected to the charge device model ESD protection circuit 140.

In another embodiment, the electrostatic protection device comprises a first port of the four ports connected to an external input port. The electrostatic protection device further comprises a second port of the four ports connected to the human body model ESD protection circuit. The electrostatic protection device further comprises a third port connected to the charge device model ESD protection circuit. The electrostatic protection device further comprises a fourth port of the four ports connected to the impedance matching circuit. The electrostatic protection device further comprises an internal input port configured for connecting between the input port of the electronic circuit and the charge device model ESD protection circuit.

In the above embodiment, the first port may be connected to a first input of the first coil. The second port may be connected to a second input of the first coil and a first input of the second coil. The third port is connected to a second input of the second coil and a first input of the third coil. The fourth port is connected to a second input of the third coil.

Figure 3:
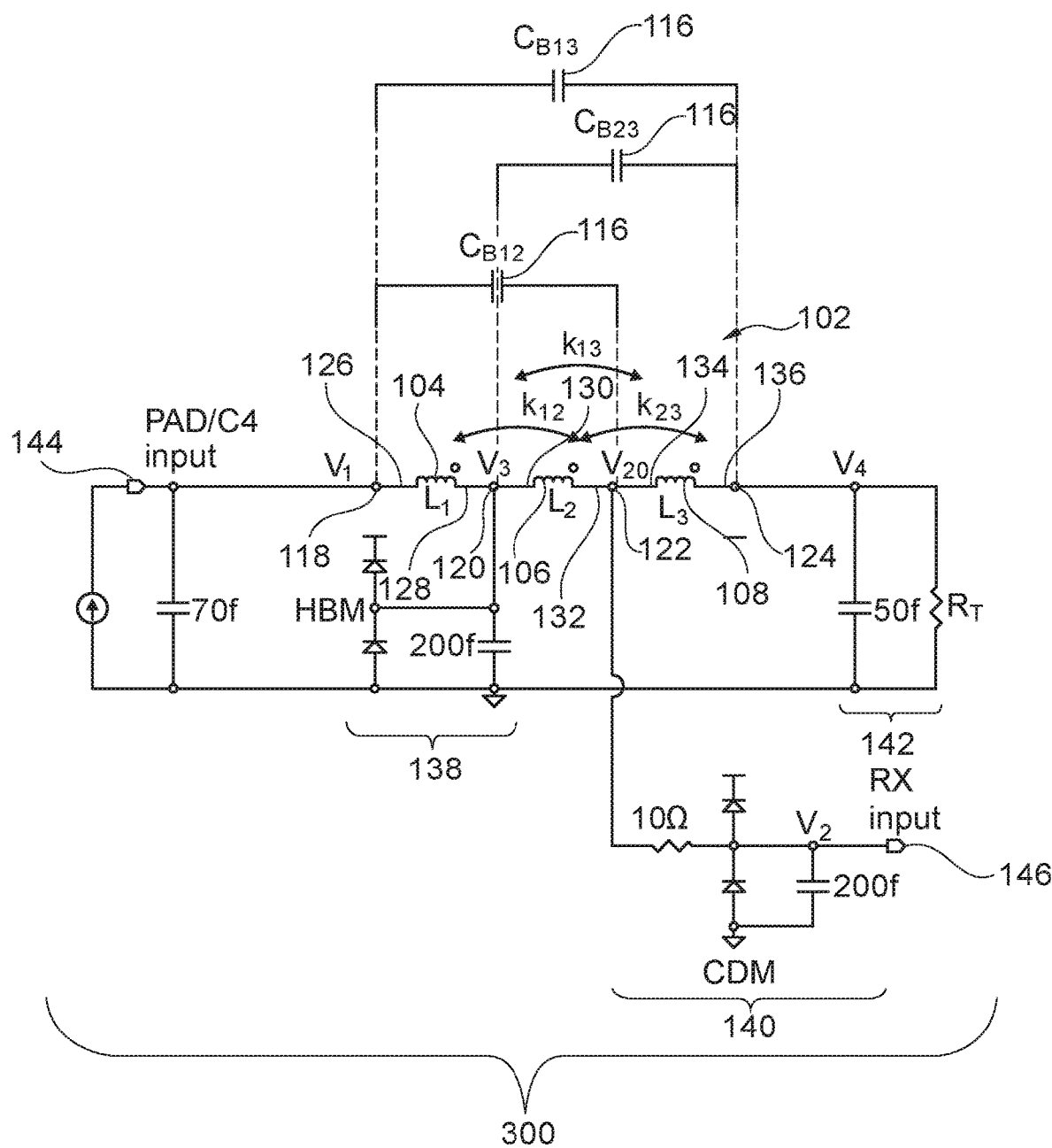
FIG. 3 illustrates a further embodiment of an electrostatic protection device.

FIG. 3 illustrates a concrete example of the above embodiment of an electrostatic protection device 300. The electrostatic protection device 300 shown in FIG. 3 is similar to the electrostatic protection device 100 shown in FIG. 1. The electrostatic protection device 300 shown in FIG. 3 differs from that in FIG. 1 in that the ports which the human body model ESD protection circuit 138 and the charge device model ESD protection circuits 140 are connected to are swapped. In the embodiment shown in FIG. 3 the charge device model ESD protection circuit 140 is connected to the third port 122. The human body model ESD protection circuit 138 is shown as being connected to the second port 120.

In another embodiment, the electrostatic protection device comprises a first port of the four ports connected to an external input port. The electrostatic protection device further comprises a second port connected to the human body model ESD protection circuit. The electrostatic protection device further comprises a third port connected to the impedance matching circuit. The electrostatic protection device further comprises a fourth port of the four ports connected to the charge device model ESD protection circuit. The electrostatic protection device further comprises an internal input port configured for connecting between the input port of the electronic circuit and the human body model ESD protection circuit.

In the above embodiment, the first port may be connected to a first input of the first coil. The second port may be connected to a second input of the first coil, a first input of the second coil, and a first input of the third coil. The third port may be connected to a second input of the second coil. The fourth port may be connected to a second input of the third coil.

Figure 4:
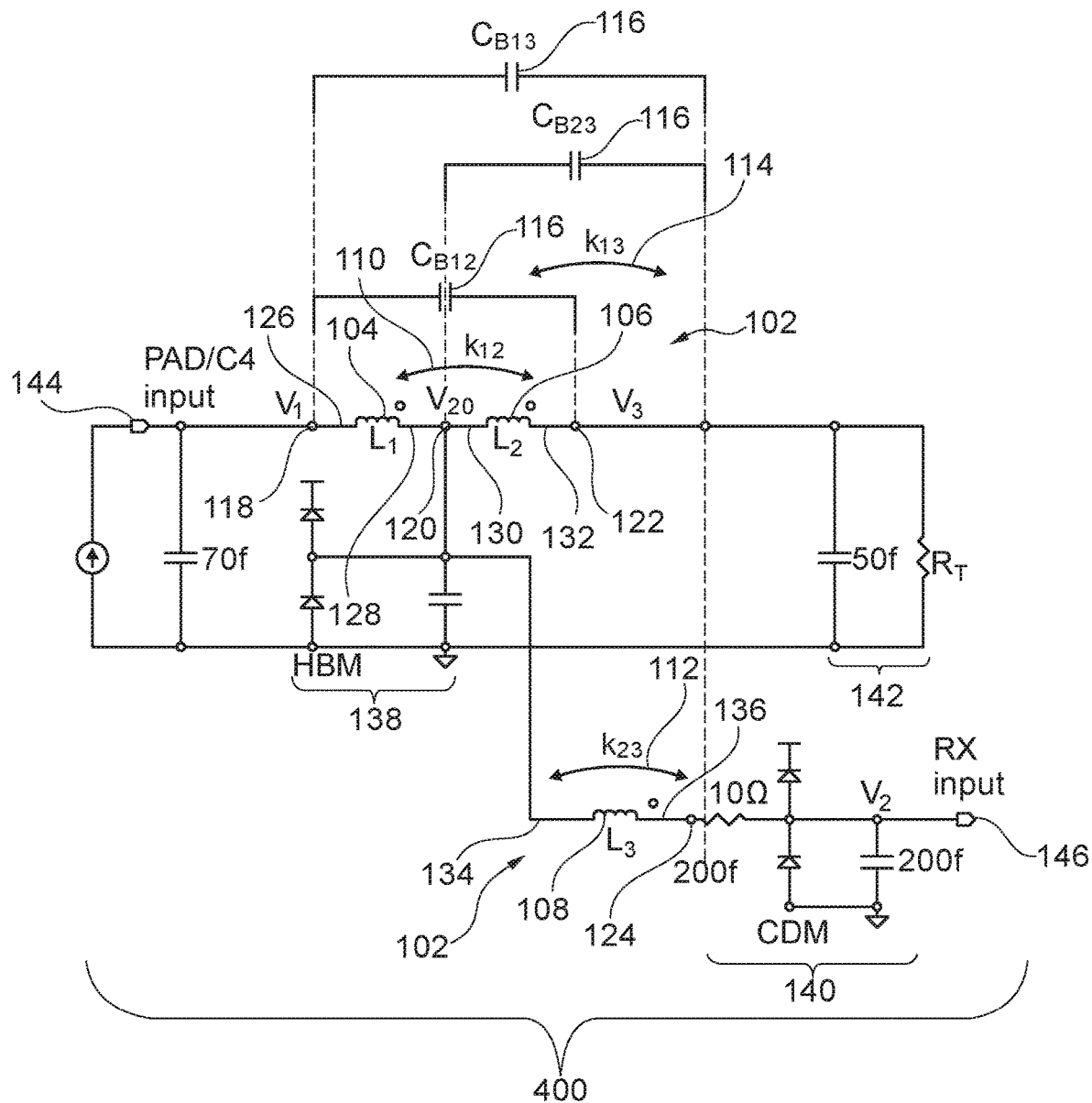
FIG. 4 illustrates a further embodiment of an electrostatic protection device.

FIG. 4 illustrates a concrete example of the above embodiment of an electrostatic protection device 400. The example shown in FIG. 4 again has a stacked coil assembly 102 that comprises a first coil 104, a second coil 106 and a third coil 108. 110 again represents a coupling coefficient between the first and second coil. 112 again represents a coupling coefficient between a second and third coil 108. 114 again represents a coupling coefficient between the first 104 and the third coil 108. The stacked coil assembly 102 has a first port 118, a second port 120, a third port 122, and a fourth port 124. The first port 118 is connected to a first input 126 of the first coil 104. The second port 120 is connected to a second input 128 of the first coil 104 and a first input 130 of the second coil 106. The third port 122 is connected to a second input 132 of the second coil 106. The second port 120 is also connected to a first input 134 of the third coil 108. The fourth port 124 is connected to a second input 136 of the third coil 108.

The external input port 144 is shown as being connected to the first port 118. The human body model ESD protection circuit 138 is shown as being connected to the second port 120. The impedance matching circuit 142 is shown as being connected to the third port 122. The charge device model ESD protection circuit 140 is shown as being connected to the fourth port 124. The internal input port 146 is shown as being connected to the charge device model ESD protection circuit 140.

In another embodiment, the invention may provide for an integrated circuit comprising an electrostatic protection device according to an embodiment as herein described.

In one embodiment, the integrated circuit is a microprocessor.

In another embodiment, the integrated circuit is a microcontroller.

In another embodiment, the integrated circuit is a graphical processing unit.

In another embodiment, the integrated circuit is a central processing unit.

In another embodiment, the integrated circuit is a wideband amplifier.

In another embodiment, the integrated circuit is an analogue-to-digital converter.

In another embodiment, the integrated circuit is a digital-to-analogue converter.

In another embodiment, the integrated circuit is a wire line transceiver circuit.

In another embodiment, the integrated circuit is a telecommunications chip.

In another embodiment, the integrated circuit comprises a substrate. The electronic circuit may be formed on the substrate. The electronic protection device is formed on the substrate. The stacked coil assembly comprises a first coil, a second coil, and a third coil. The first coil, the second coil, and the third coil may be formed on separate layers of the substrate. The first coil is adjacent to the second coil. The second coil is adjacent to the third coil.

Figure 5:
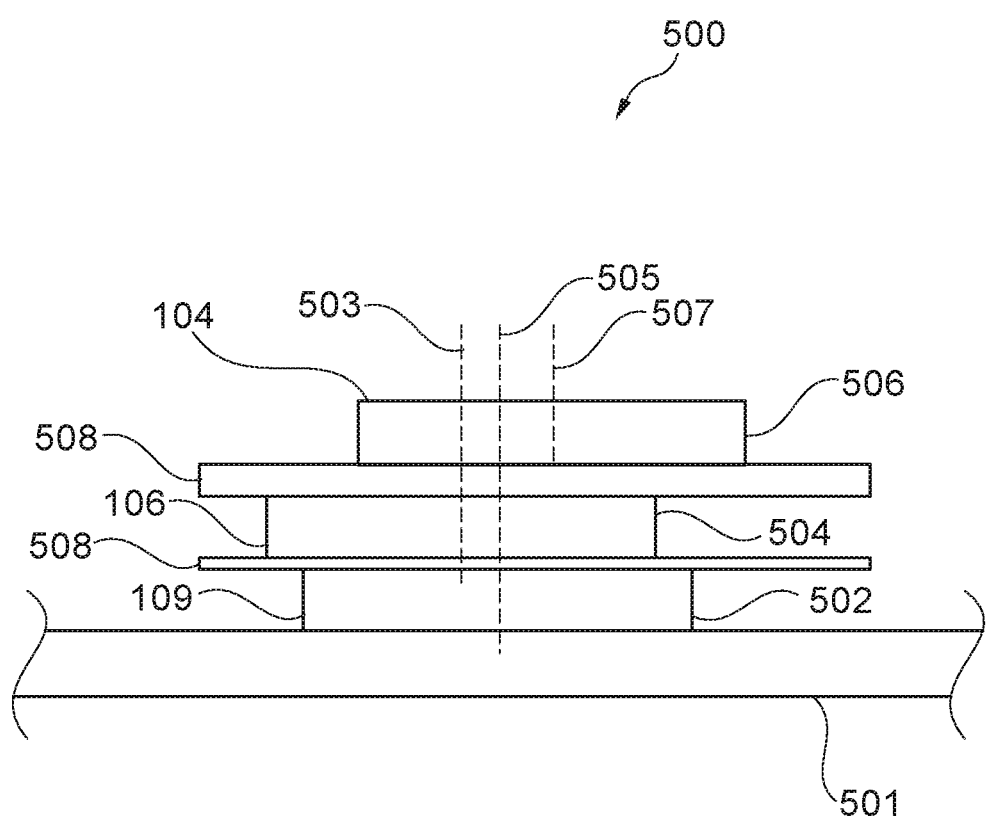
FIG. 5 illustrates a portion of an embodiment of an integrated circuit.

The above embodiment is illustrated in FIG. 5. In FIG. 5 a portion of an integrated circuit 500 is shown as being formed on a substrate 501. There is a first layer 502, a second layer 504, and a third layer 506 formed upon the substrate 501. Between the first 502 and second 504 layers there is an insulating layer 508. Between the second 504 and the third 506 layers there is also an insulating layer 508. The first coil 104 is this example is formed in the third layer 506. The second coil 106 is formed in the second layer 504 and the third coil 108 is formed in the first layer 502. The first layer 502 is shown as being in contact with the substrate 500. Vias between the layers 502, 504, 506 could be used to connect the various coils 104, 106, 108.

The first coil 104 has a first axis 507. The second coil 106 has a second axis 505. The third coil 108 has a third axis 503. Each of the coils 104, 106, 108 is planar and within its layer. Each axis 503, 505, 507 axis is perpendicular to its coil 104, 106, 108 and travels through a center of its coil 104, 106, 108. The thickness of the insulating layers could possibly be adjusted to adjust capacitive and inductive coupling between the coils 104, 106, 108. Additionally, the location of the axis 104, 106, 108 can be shifted relative to each other within a two dimensional plane. This further allows an adjustment of the inductive and capacitive coupling between the coils 104, 106, 108.

Figure 6:
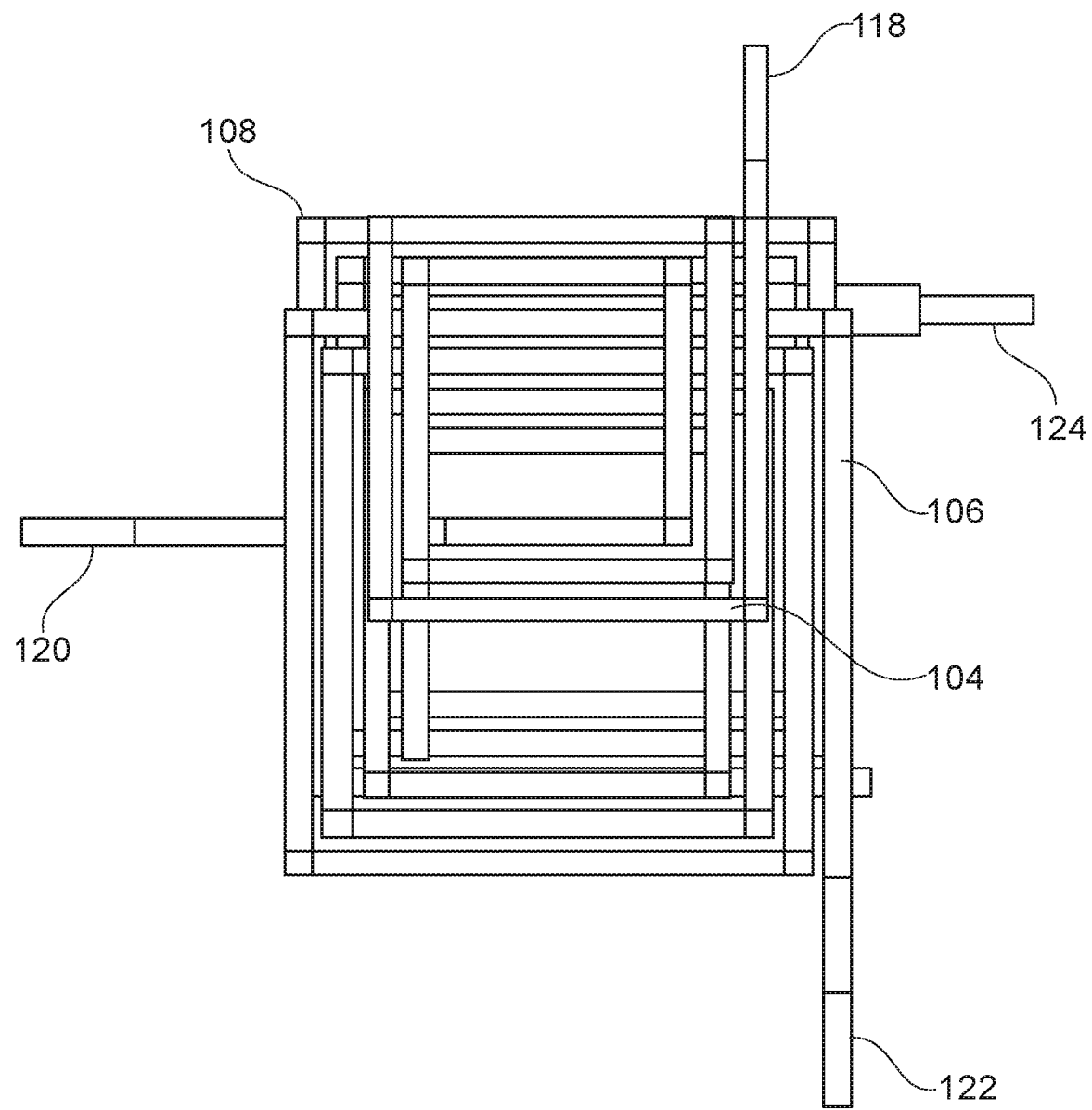
FIG. 6 shows a top view of a stacked coil assembly.
Figure 7:
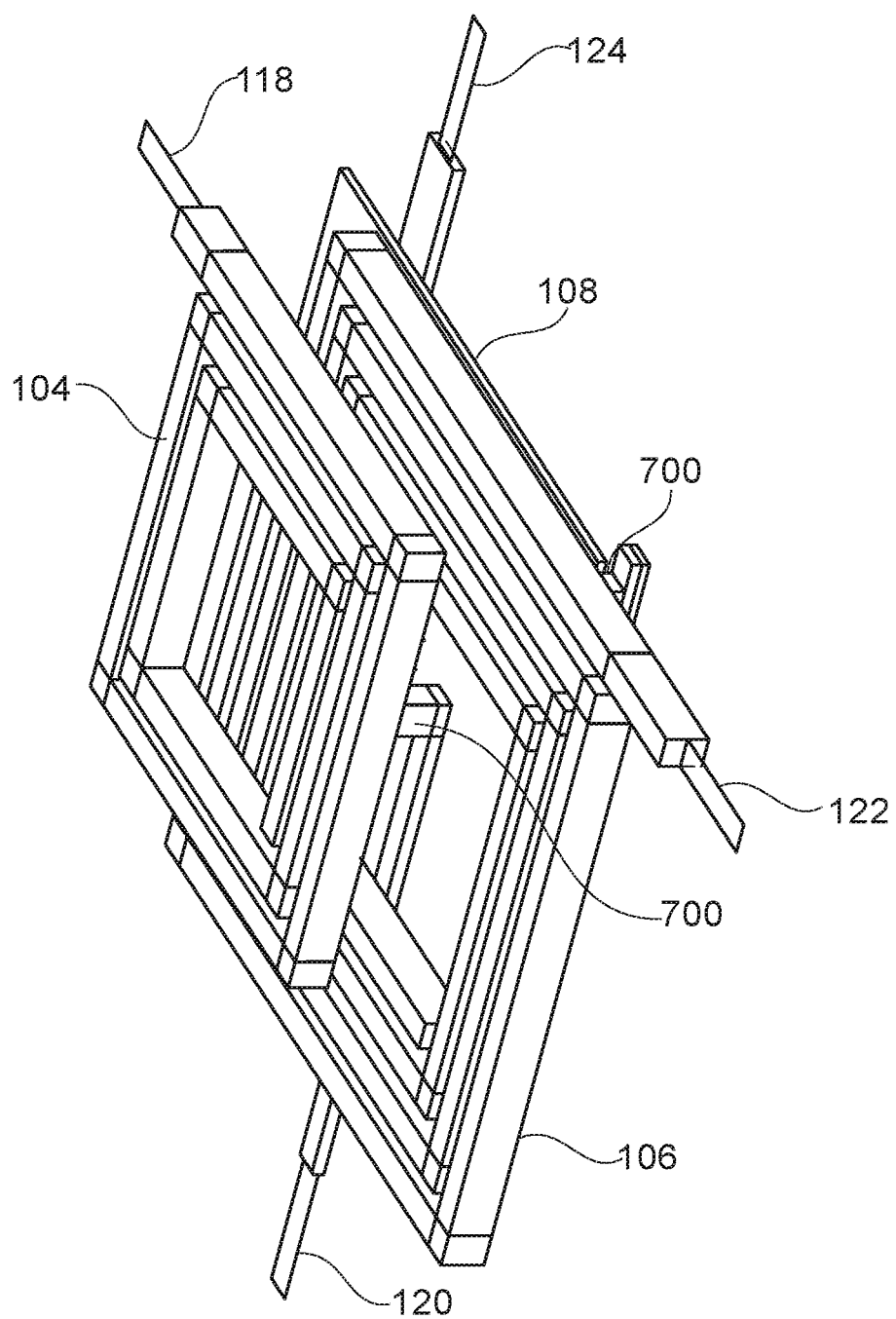
FIG. 7 shows a perspective view of the stacked coil assembly of FIG. 6.
Figure 8:
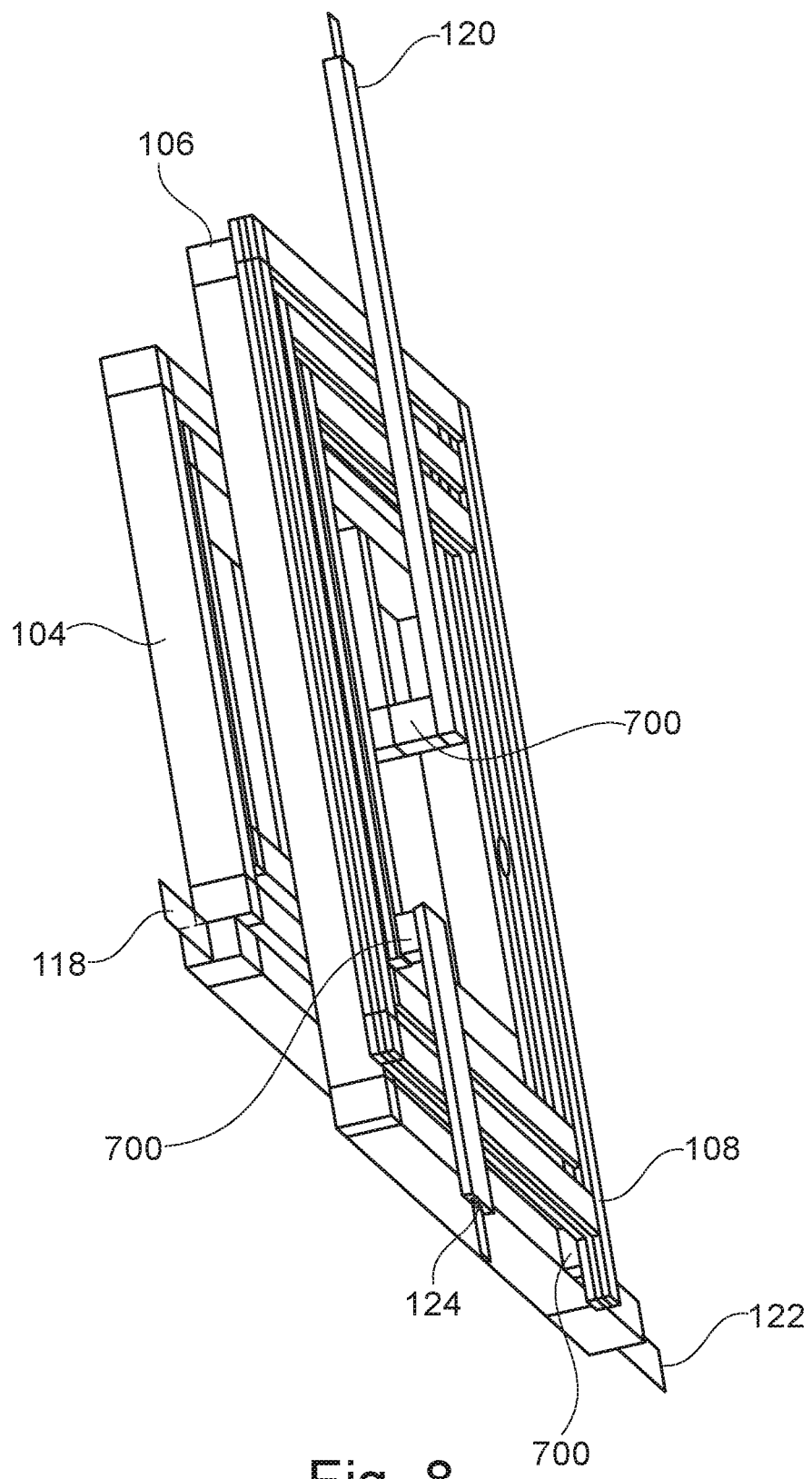
FIG. 8 shows a further perspective view of the stacked coil assembly of FIG. 6.

FIGS. 6, 7 and 8 show three views which illustrate how the coils of the stacked coil assembly could be formed in layers such is shown in FIG. 5. The arrangement shown in FIGS. 6, 7 and 8 show via connections which could be used to implement the stacked coil assembly 102 as is illustrated in FIGS. 1, 2 and 3. The stacked coil assembly 102 in FIG. 4 has different connections between the three coils.

In FIGS. 6, 7 and 8 the first 104, 106, and 108 coils are all visible. FIG. 6 is a top view. FIG. 7 is a perspective view from the top. FIG. 8 is a perspective view from the bottom. It can be seen in these Figs. that the first coil 104, the second coil 106, and the third coil 108 are all planar coils. The center of these coils is not shown but a center from each of the coils could be used to draw a point for an axis. It can be seen that each of the three coils 104, 106 and 108 do not have centers or axes that align with each other. The positioning of the coils relative to each other allows the mutual inductance to be tuned. Adjusting the positioning of the coils also may change the capacitance. However the capacitive coupling between the coils can be controlled separately by using external capacitors between the different coils and adjusting their value. The size of the coils 104, 106, 108 is also an additional design parameter. In many conventional systems only two coils are used. The use of an additional coils provides additional design variables which can be used to increase both the bandwidth as well as reducing transmission loss. There are a number of vias 700 which are used to connect between the different layers. As is particularly illustrated in FIGS. 7 and 8 the width of the traces of the coils can also be adjusted as well as the distance between the coils. In FIG. 8 it is apparent that the third coil 108 is thinner than the other two coils 104, 106. This may be determined by the thickness of the layers in the CMOS process that is used. In FIG. 8 the third coil 108 is shown as being located closer to the second coil 106.

When designing a stacked coil assembly such as is depicted in FIGS. 6, 7, and 8 there are several design parameters that may be varied. The trace width and spacing of the traces used to form each coil may be varies. The diameter of each of the coils may also be varied. The distance or displacement between the coils may also be varied.

A design methodology which could be followed to design an electrostatic protection device may include setting up a test bench (a simulation) with ESD protection circuits schematics and it may contain extracted parasitic capacitances. The design methodology may also include implementing a model of the stacked coil assembly and other components of the electrostatic protection device that uses ideal elements and parameters for values of: inductances, coupling coefficients between the coils, resistances, and capacitances. These values can then be optimized by finding optimal size and placement of coil within the stacked coil assembly that result in both an optimized eye aperture, sufficient S11, and sufficient ESD protection.

An electrostatic protection device modeled after the example illustrated in FIG. 1 was performed taking the impedance matching value to be a 50 ohms impedance, as it is normally considered as a de facto standard. The scattering parameter S11, which measures the return loss, is useful to evaluate the performance and quality of the impedance matching. A return loss value of −10 dB or less indicates a good impedance matching. Simulations of the circuit depicted in FIG. 1, show that it achieves sufficiently good input impedance matching (e.g. S11<−10 dB up to 16 GHz). It also fulfills with margin the ESD protection requirements (e.g. Human Body Model (HBM) >1 kV, Charge Device Model (CDM) >200V).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrostatic protection device for protecting an input port of an electronic circuit, comprising:
    a stacked coil assembly with four ports;
    a human body model ESD protection circuit;
    a charge device model ESD protection circuit; and
    an impedance matching circuit;
    wherein the human body model ESD protection circuit, the charge device model ESD protection circuit, and the impedance matching circuit are connected to separate ports selected from the four ports.

2. The electrostatic protection device of claim 1, wherein the stacked coil assembly comprises a first coil, a second coil, and a third coil.

3. The electrostatic protection device of claim 2, wherein the first coil is at least partially overlapping with the second coil, and wherein the second coil is at least partially overlapping with the third coil.

4. The electrostatic protection device of claim 3, wherein:
    the first coil has a first axis,
    the second coil has a second axis,
    the third coil has a third axis,
    the first axis is offset from the second axis,
    the second axis is offset from the third axis, and
    the first axis is offset from the third axis.

5. The electrostatic protection device of claim 2, wherein the first coil is inductively coupled to the second coil, the second coil is inductively coupled to the third coil, and the first coil is inductively coupled to the third coil.

6. The electrostatic protection device of claim 2, wherein:
    the electrostatic protection device comprises a first port of the four ports connected to an external input port,
    the electrostatic protection device further comprises a second port of the four ports connected to the charge device model ESD protection circuit,
    the electrostatic protection device further comprises a third port connected to the human body model ESD protection circuit,
    the electrostatic protection device further comprises a fourth port of the four ports connected to the impedance matching circuit, and
    the electrostatic protection device further comprises an internal input port configured for connecting between the input port of the electronic circuit and the charge device model ESD protection circuit.

7. The electrostatic protection device of claim 6, wherein the first port is connected to a first input of the first coil, the second port is connected to a second input of the first coil and a first input of the second coil, the third port is connected to a second input of the second coil and a first input of the third coil, and the fourth port is connected to a second input of the third coil.

8. The electrostatic protection device of claim 2, wherein:
    the electrostatic protection device comprises a first port of the four ports connected to the charge device model ESD protection circuit,
    the electrostatic protection device further comprises a second port connected to an external input port configured for connecting to the input port of the electronic circuit, the electrostatic protection device further comprises a
third port of the four ports connected to the human body
model ESD protection circuit,
the electrostatic protection device further comprises a
fourth port of the four ports connected to the impedance
matching circuit, and
the electrostatic protection device further comprises an
internal input port configured for connecting between
the input port of the electronic circuit and the charge
device model ESD protection circuit.

9. The electrostatic protection device of claim 8, wherein the first port is connected to a first input of the first coil, the second port is connected to a second input of the first coil and a first input of the second coil, the third port is connected to a second input of the second coil and a first input of the third coil, and the four port is connected to a second input of the third coil.

10. The electrostatic protection device of claim 2, wherein:
the electrostatic protection device comprises a first port of the four ports connected to an external input port,
the electrostatic protection device further comprises a second port of the four ports connected to the human body model ESD protection circuit,
the electrostatic protection device further comprises a third port connected to the charge device model ESD protection circuit,
the electrostatic protection device further comprises a fourth port of the four ports connected to the impedance matching circuit, and
the electrostatic protection device further comprises an internal input port configured for connecting between the input port of the electronic circuit and the charge device model ESD protection circuit.

11. The electrostatic protection device of claim 10, wherein the first port is connected to a first input of the first coil, the second port is connected to a second input of the first coil and a first input of the second coil, the third port is connected to a second input of the second coil and a first input of the third coil, and the four port is connected to a second input of the third coil.

12. The electrostatic protection device of claim 2, wherein:
the electrostatic protection device comprises a first port of the four ports connected to an external input port,
the electrostatic protection device further comprises a second port connected to the human body model ESD protection circuit,
the electrostatic protection device further comprises a third port connected to the impedance matching circuit,
the electrostatic protection device further comprises a fourth port of the four ports connected to the charge device model ESD protection circuit, and
the electrostatic protection device further comprises an internal input port configured for connecting between the input port of the electronic circuit and the human body model ESD protection circuit.

13. The electrostatic protection device of claim 12, wherein:
the first port is connected to a first input of the first coil;
the second port is connected to a second input of the first coil, a first input of the second coil, and a first input of the third coil;
the third port is connected to a second input of the second coil; and
the fourth port is connected to a second input of the third coil.

14. An integrated circuit comprising:
an electronic circuit having an input port; and
an electrostatic protection device for protecting the input port of the electronic circuit, the electrostatic protection device in turn comprising:
a stacked coil assembly with four ports;
a human body model ESD protection circuit,
a charge device model ESD protection circuit, and
an impedance matching circuit;
wherein the human body model ESD protection circuit, the charge device model ESD protection circuit, and the impedance matching circuit are connected to separate ports selected from the four ports.

15. The integrated circuit of claim 14, wherein the integrated circuit comprises at least one of: a microprocessor, a microcontroller, a graphical processing unit, a central processing unit, wide band amplifier, analog to digital converter, digital to analog converter, wireline transceiver circuit, and a telecommunications chip.

16. The integrated circuit of claim 15, wherein:
the integrated circuit comprises a substrate;
the electronic circuit is formed on the substrate;
the electrostatic protection device is formed on the substrate;
the stacked coil assembly comprises a first coil, a second coil, and a third coil;
the first coil, the second coil, and the third coil are formed on separate layers on the substrate;
the first coil is adjacent to the second coil; and
the second coil is adjacent to the third coil.

17. The integrated circuit of claim 16, wherein:
the first coil has a first axis,
the second coil has a second axis,
the third coil has a third axis,
the first axis is offset from the second axis,
the second axis is offset from the third axis, and
the first axis is offset from the third axis.

18. The integrated circuit of claim 16, wherein the first coil is inductively coupled to the second coil, the second coil is inductively coupled to the third coil, and the first coil is inductively coupled to the third coil.

19. The integrated circuit of claim 14, wherein:
the electrostatic protection device comprises a first port of the four ports connected to an external input port,
the electrostatic protection device further comprises a second port of the four ports connected to the charge device model ESD protection circuit,
the electrostatic protection device further comprises a third port connected to the human body model ESD protection circuit,
the electrostatic protection device further comprises a fourth port of the four ports connected to the impedance matching circuit, and
the electrostatic protection device further comprises an internal input port configured for connecting between the input port of the electronic circuit and the charge device model ESD protection circuit.

20. The integrated circuit of claim 19, wherein the first port is connected to a first input of the first coil, the second port is connected to a second input of the first coil and a first input of the second coil, the third port is connected to a second input of the second coil and a first input of the third coil, and the fourth port is connected to a second input of the third coil.

* * * * *